United States Patent
Park et al.

(10) Patent No.: US 8,022,621 B2
(45) Date of Patent: Sep. 20, 2011

(54) ORGANIC LIGHT EMITTING DISPLAY DEVICE

(75) Inventors: Jaeyong Park, Gyeonggi-do (KR); Kwansoo Kim, Kyungbuk (KR); Hyeyoung Choi, Seoul (KR); Miyoun Yang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 379 days.

(21) Appl. No.: 12/314,527

(22) Filed: Dec. 11, 2008

(65) Prior Publication Data

US 2010/0026167 A1 Feb. 4, 2010

(30) Foreign Application Priority Data

Jul. 31, 2008 (KR) .................. 10-2008-0075096

(51) Int. Cl.
*H01L 51/00* (2006.01)
*H01L 51/50* (2006.01)
*H01L 51/52* (2006.01)

(52) U.S. Cl. ............... 313/506; 313/509; 315/169.3
(58) Field of Classification Search .......... 313/498–512; 315/169.1, 169.3
See application file for complete search history.

(56) References Cited

U.S. PATENT DOCUMENTS

| | | | |
|---|---|---|---|
| 6,175,345 B1 * | 1/2001 | Kuribayashi et al. | 345/76 |
| 6,392,255 B1 * | 5/2002 | Shibata et al. | 257/59 |
| 6,724,458 B2 * | 4/2004 | Kim et al. | 349/156 |
| 7,196,465 B2 * | 3/2007 | Park et al. | 313/505 |
| 7,518,147 B2 * | 4/2009 | Bae et al. | 257/72 |
| 2004/0004432 A1 * | 1/2004 | Park et al. | 313/504 |
| 2004/0080262 A1 * | 4/2004 | Park et al. | 313/498 |
| 2004/0135496 A1 * | 7/2004 | Park et al. | 313/504 |
| 2005/0017649 A1 * | 1/2005 | Tanabe | 315/169.2 |
| 2005/0140287 A1 * | 6/2005 | Ko | 313/506 |
| 2005/0247936 A1 * | 11/2005 | Bae et al. | 257/59 |
| 2006/0055313 A1 * | 3/2006 | Bae et al. | 313/500 |
| 2006/0061262 A1 * | 3/2006 | Yoo et al. | 313/503 |
| 2006/0081854 A1 * | 4/2006 | Kim et al. | 257/72 |
| 2007/0132374 A1 * | 6/2007 | Park | 313/504 |
| 2008/0122372 A1 * | 5/2008 | Yoo et al. | 315/169.3 |
| 2010/0127615 A1 * | 5/2010 | Kim et al. | 313/504 |

* cited by examiner

*Primary Examiner* — Nimeshkumar Patel
*Assistant Examiner* — Jose M Diaz
(74) *Attorney, Agent, or Firm* — Morgan, Lewis & Bockius LLP

(57) ABSTRACT

Provided is an organic light emitting display device. The organic light emitting display device comprises a first substrate, a second substrate facing the first substrate, a transistor on the first substrate, a first contact electrode disposed on the transistor and connected to a source or a drain of the transistor, a subpixel on the second substrate, and a first spacer projected to make an upper electrode included in the subpixel to be in contact with the first contact electrode. An upper surface area of the first spacer is about 0.5% to 20% of an upper surface area of the subpixel.

13 Claims, 3 Drawing Sheets

ORGANIC LIGHT EMITTING DISPLAY DEVICE

This application claims the benefit of Korean Patent Application No. 10-2008-0075096 filed on Jul. 31, 2008 which is hereby incorporated by reference in its entirety.

BACKGROUND

1. Field of the Invention

This document relates to an organic light emitting display device.

2. Related Art

An organic light emitting element used in an organic light emitting display device was a self emissive element comprising an emission layer disposed between two electrodes formed on a substrate.

The organic light emitting display device is classified into a top-emission type, a bottom-emission type, and a dual-emission type according to a light emission direction. The organic light emitting display device is also classified into a passive matrix type and an active matrix type according to a driving method.

The organic light emitting display device selects one from a plurality of subpixels arranged in matrix and controls the selected pixel to emit light by applying a scan signal, a data signal, and power to the plurality of subpixels arranged in matrix, thereby displaying images.

Meanwhile, some of organic light emitting display devices according to the related art comprise a first substrate and a second substrate. Each of the first and second substrates includes a transistor and an organic light emitting diode, and the first substrate and the second substrate are sealed together through adhesive member. Such an organic light emitting display device according to the related art also includes a spacer that is protruded for helping electric connection between the transistor on the first substrate and the organic light emitting diode on the second substrate.

However, a contact electrode connected to a source or a drain of the transistor may be poorly contacted with an upper electrode on the spacer of an organic light emitting diode when the first substrate and the second substrate are sealed together in the organic light emitting display device according to the related art. Such poor contact causes a black dot detect on a subpixel or abnormal operation of an element. Therefore, such a problem needs to be solved.

SUMMARY

An aspect of this document is to provide an organic light emitting display device. In an aspect, the organic light emitting display device comprising a first substrate, a second substrate facing the first substrate, a transistor on the first substrate, a first contact electrode disposed on the transistor and connected to a source or a drain of the transistor, a subpixel on the second substrate, and a first spacer projected to make an upper electrode included in the subpixel to be in contact with the first contact electrode, wherein an upper surface area of the first spacer is about 0.5% to 20% of an upper surface area of the subpixel.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION OF THE PREFERRED EMBODIMENTS

Reference will now be made in detail embodiments of the invention examples of which are illustrated in the accompanying drawings.

Figure 1:
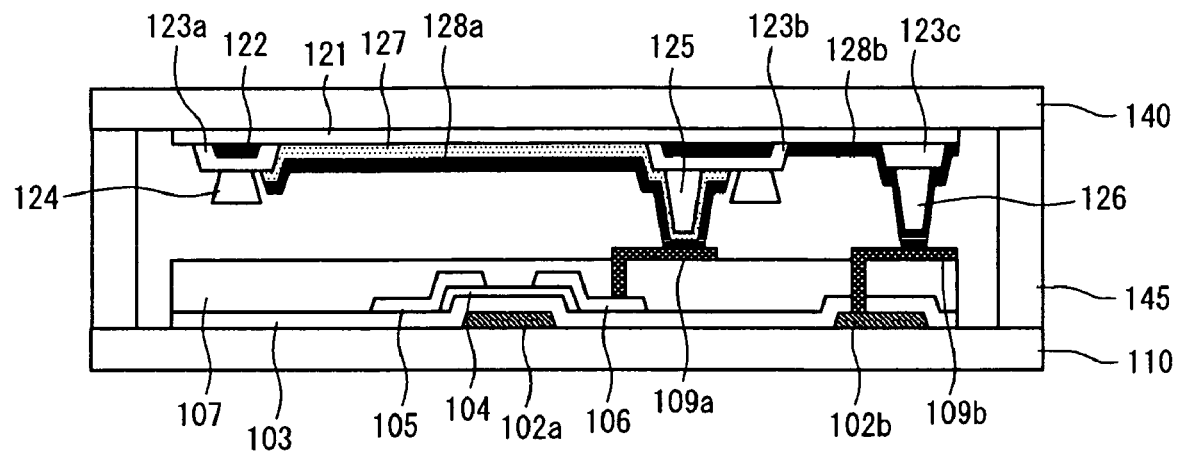
FIG. 1 is a cross-sectional view of an organic light emitting display device according to an exemplary embodiment of the invention.
Figure 3:
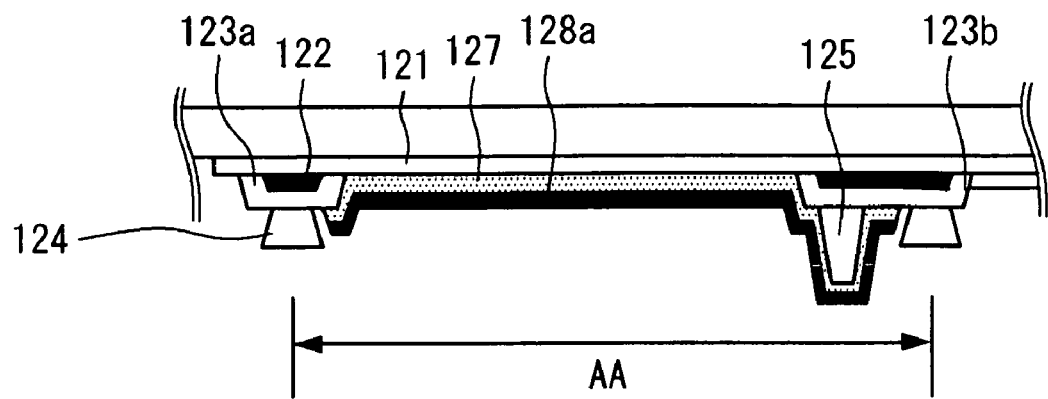
FIG. 3 is a cross-sectional view of a part of FIG. 1.
Figure 4:
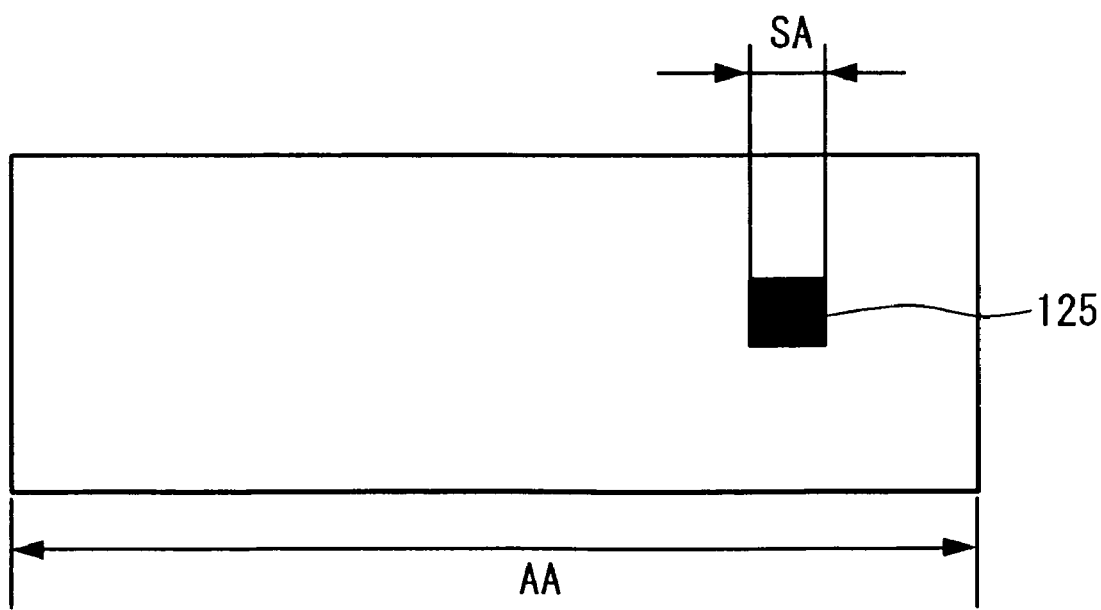
FIG. 4 is a plan view illustrating an area of a first spacer compared with an area of a subpixel.
Figure 5:
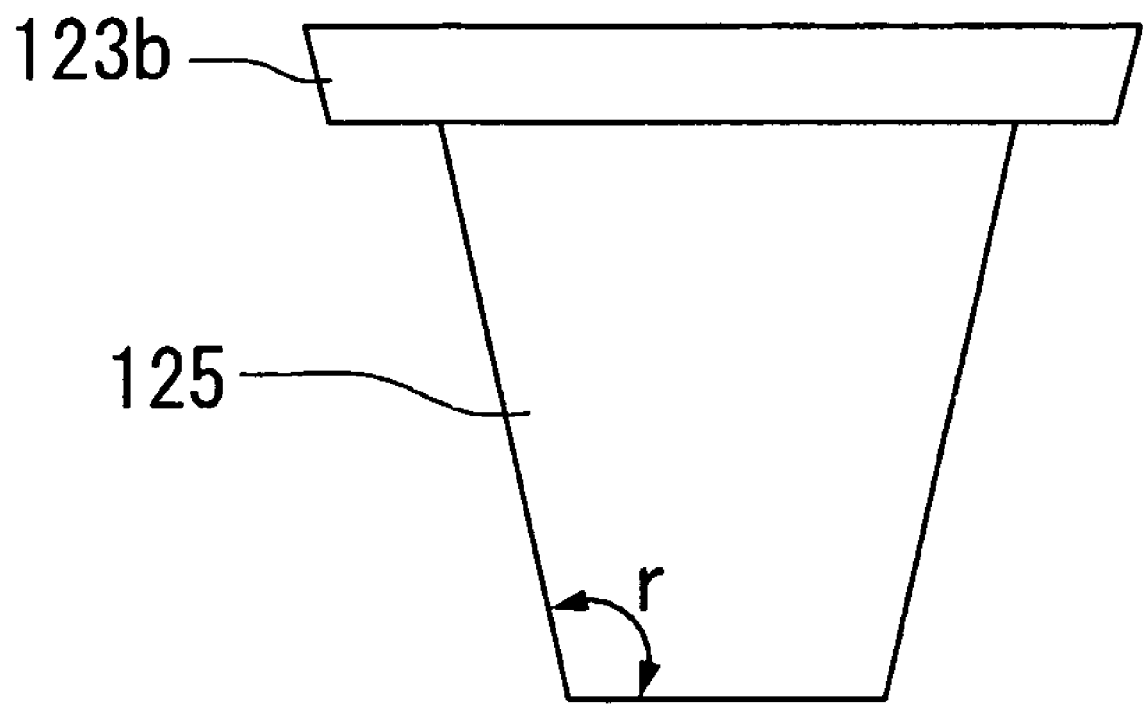
FIG. 5 is a diagram for describing a slop of a first spacer.

As shown in FIG. 1 and FIG. 3, the organic light emitting display device according to the present embodiment comprises a first substrate 110 and a second substrate 140 facing the first substrate 110. The first substrate 110 and the second substrate 140 may be sealed together through an adhesive member 145.

The first substrate 110 and the second substrate 140 may be made of material that has high strength and excellent dimensional stability for forming elements.

For example, the first substrate 110 and the second substrate 140 may be made of a glass plate, a metal plate, a ceramic plate, or a plastic plate (polycarbonate resin, acryl resin, vinyl chloride resin, polyethylene terephthalate resin, polyimide resin, polyester resin, epoxy resin, silicon resin, and fluorine resin.

A switching transistor, a driving transistor, and a capacitor may be disposed on the first substrate 110. The switching transistor, the driving transistor, and the capacitor are connected to a scan line a data line, and a power line, respectively. An organic light emitting diode, and a spacer connected to a source or a drain of the driving transistor may be disposed on the second substrate 140.

Hereinafter, the organic light emitting display device according to the present embodiment will be described in more detail with reference to schematic cross-sectional views of the transistor on the first substrate 110 and the organic light emitting diode on the second substrate 140.

A first gate 102a and a second gate 102b may be disposed on the first substrate 110. The first gate 102a may be a gate metal of the transistor formed on the first substrate 110, and the second gate 102b may be a gate metal connected to the power line on the first substrate 110. In additional, a gate metal may be further disposed on the substrate 110 as a lower electrode of the capacitor.

The first and second gates 102a and 102b may be made of one selected from the group consisting of molybdenum Mo, aluminum Al, chrome Cr, gold Au, titanium Ti, nickel Ni, neodymium Nd, copper Cu, and alloy thereof. The first gate 102a and the second gate 102b may be a multilayer formed one selected from the group consisting of molybdenum Mo, aluminum Al, chrome Cr, gold Au, titanium Ti, nickel Ni, neodymium Nd, copper Cu, and alloy thereof. The first and second gates 102a and 102b may be also a dual layer of molybdenum Mo/aluminum Al-neodymium Nd or molybdenum Mo/aluminum Al.

A first insulation layer 103 may be disposed on the first and second gates 102a and 102b. The first insulation layer 103 may be made of a silicon oxide layer SiOx, a silicon nitride layer SiNx, or may be a multilayer thereof. However, the first insulation layer 103 is not limited thereto.

An active layer 104 may be disposed on the first insulation layer 103. The active layer 104 may comprise amorphous silicon or polycrystalline silicon which is crystallized amorphous silicon. Although it is not shown, the active layer 104 may comprise a channel area, a source area, and a drain area, and the source area and the drain area may be doped with P type or N type impurities. Also, the active layer 104 may comprise an ohmic contact layer for reducing contact resistance.

A source 105 and a drain 106 may be disposed on the active layer 104. One of the source 105 and the drain 106 may be disposed to face a lower electrode of the capacitor formed on the substrate 110, thereby forming the capacitor.

The source 105 and the drain 106 may be formed as a single layer or a multilayer. If the source 105 and the drain 106 are a single layer, the source 105 and the drain 106 may be made of one selected from the group consisting of molybdenum (Mo), aluminum (Al), chrome (Cr), gold (Au), titanium (Ti), nickel (Ni), neodymium (Nd), copper (Cu), and alloy thereof. If the source 105 and the drain 106 are a multilayer, the source 105 and the drain 106 may be a dual layer of Mo/Al—Nd or Mo/Al, or a triple layer of Mo/Al—Nd/Mo.

A second insulation layer 107 may be disposed on the source 105 and the drain 106. The second insulation layer 107 may be a silicon oxide layer SiOx, a silicon nitride layer SiNx, or a multilayer thereof. However, the second insulation layer 107 is not limited thereto. The second insulating layer 116 may be a passivation layer or a planarization layer.

A first contact electrode 109a may be disposed on the second insulation layer 107. The first contact electrode 109a is connected to the source 105 or the drain 106 of the transistor. Also, a second contact electrode 109b may be disposed on the second insulation layer 107. The second contact electrode 109b is connected to the second gate 102b. The second contact electrode 109b may be disposed on at least one of transistors or on an outline of the first substrate 110.

Hereinbefore, a bottom gate type transistor was described as an example of the transistor disposed on the first substrate 110. However, the transistor disposed on the first substrate 110 is not limited thereto. A top gate type transistor may be disposed on the first substrate 110.

Unlike the bottom gate type transistor, the top gate type transistor includes a gate formed at a layer higher than the active layer.

Meanwhile, a lower electrode 121 may be disposed on the second substrate 140. The lower electrode 121 may be selected as an anode. The lower electrode 121 selected as the anode may be made of transparent material such as Indium Tin Oxide (ITO), Indium Zinc Oxide (IZO), Indium Tin Zinc Oxide (ITZO), and ZnO doped Al2O3 (AZO).

The lower electrode 121 may be connected to an auxiliary electrode 122. For example, the auxiliary electrode 122 may be disposed on the lower electrode 212. The auxiliary electrode 122 may be made of one of molybdenum (Mo), aluminum (Al), chrome (Cr), gold (Au), titanium (Ti), nickel (Ni), neodymium (Nd), and copper (Cu).

Bank layers 123a, 123b, 123c may be disposed on the lower electrode 121 and the auxiliary electrode 122. The bank layer 123a, 123b, and 123c may include organic material such as benzocyclobutene resin, acryl resin, or polyimide region. The bank layers 123a and 123b may have openings for exposing the lower electrode 121.

A barrier 124 may be disposed on the bank layers 123a and 123b. The barrier 124 defines a subpixel area. The barrier 124 may be formed for making a process convenient when the organic light emitting layer and the upper electrode are formed in following processes. The barrier 124 may be formed in a reverse taper type having a base area narrower than an upper area.

Meanwhile, the auxiliary electrode 122 may be disposed at a lower part of the barrier 124 that is formed on the bank layers 123a and 123b having the opening for defining a subpixel area. That is, the auxiliary electrode 122 overlaps with an area where the barrier 124 is disposed.

A first spacer 125 may be disposed on the bank layer 123b. The first spacer 125 may be made of an organic material or an inorganic material. However, the first spacer 135 is not limited thereto. The first spacer 125 is projected to be in contact with the first contact electrode 109a disposed on the substrate 110 when the first substrate 110 is sealed with the second substrate 140. Since the first spacer 125 helps electric connection between the first contact electrode 109a on the first substrate 110 and the upper electrode 128a on the second substrate 140, setting an area and a slop of the first spacer 125 is very important. Hereinafter, it will be described in more detail in later.

A second spacer 126 may be disposed on the bank layer 123c. The second spacer 126 may be disposed at an outer area of the second substrate 140. The second spacer 126 is projected to be in contact with a second contact electrode 109b disposed on the first substrate when the first substrate 110 is sealed with the second substrate 140.

An organic light emitting layer 127 may be disposed on a lower electrode 121 exposed through the openings of the bank layers 123a and 123b. The organic light emitting layer 127 may be divided into subpixel areas (AA) by the barrier 124.

Figure 2:
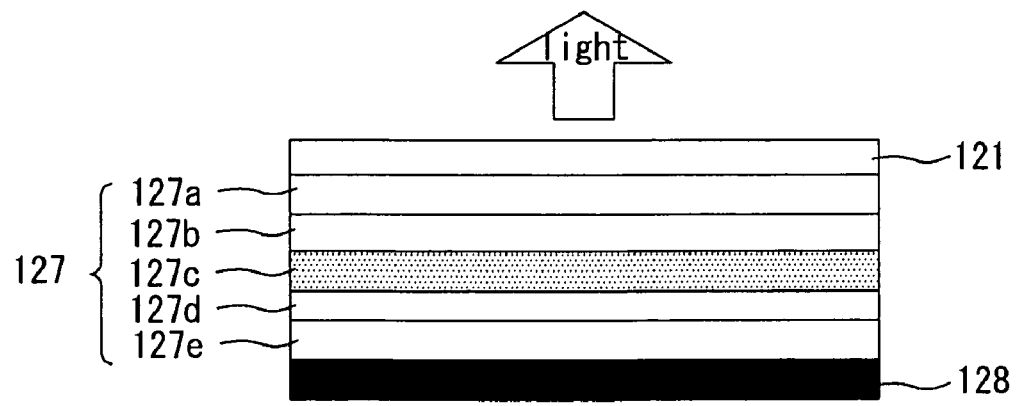
FIG. 2 is a diagram illustrating a structure of an organic light emitting diode.

Referring to FIG. 2, the organic light emitting layer 127 may includes a hole injection layer 127a, a hole transport layer 127b, an emission layer 127c, an electron transport layer 127d, and an electron injection layer 127e.

The hole injection layer 127a makes the injection of hole smooth. The hole injection layer 127a may be made of one selected from the group consisting of cupper phthalocyanine (CuPc), poly(3,4)-ethylenedioxythiophene (PEDOT), polyaniline (PANI), and N,N-dinaphthyl-N,N'-diphenyl benzidine (NPD). However, the hole injection layer 127a is not limited thereto.

The hole transport layer 127d makes the transport of holes smooth. The hole transport layer 121d may be made of one selected from the group consisting of N,N-dinaphthyl-N,N'-diphenyl benzidine (NPD), N,N'-bis-(3-methylphenyl)-N,N'-bis-(phenyl)-benzidine (TPD), s-TAD, and 4,4',4"-Tris(N-3-methylphenyl-N-phenyl-amino)-triphenylamine (MTDATA). However, the hole transport layer 127d is not limited thereto.

The emission layer 127c may comprise material that emits red, green, or blue light. Also, the emission layer 127c may be made of phosphorescent or fluorescent material.

If the emission layer 127c is red, the emission layer 127c may be made of phosphorescent material including host material having carbazole biphenyl (CBP) or 1,3-bis(carbazol-9-yl) mCP, and dopant having at least one of the group consisting of PIQIr(acac)(bis(1-phenylisoquinoline)acetylacetonate iridium), PQIr(acac)(bis(1-phenylquinoline) acetylacetonate iridium), PQIr(tris(1-phenylquinoline)iridium), and PtOEP(octaethylporphyrin platinum). Also, the emission layer 127c may be made of fluorescent material having PBD:Eu(DBM)3(Phen) or Perylene.

If the emission layer 127c is green, the emission layer 127c may be made of material including a phosphorescent material having host material having CBP or mCP and dopant material having Ir(ppy)3(fac tris(2-phenylpyridine)iridium).

Unlikely, the emission layer 127c may be made of a fluorescent material having Alq3(tris(8-hydroxyquinolino)aluminum).

If the emission layer 127c is blue, the emission layer 127c may made of phosphorescent material including host material CBP or mCP and dopant material having (4,6-F2ppy)2Irpic. Unlikely, the emission layer 127c may be made of fluorescent material having one selected from the group consisting of spiro-DPVBi, spiro-6P, distryrylbenzene (DSB), distyryl arylene (DSA), PFO polymer, and PPV polymer. However, the emission layer 127c is not limited thereto.

The electron transport layer 127d makes the transport of electrons smooth and may be made of Alq3(tris(8-hydroxyquinolino)aluminum), PBD, TAZ, spiro-PBD, BAlq, LiF, or SAlq. However, the electron transport layer 127b is not limited thereto.

The electron injection layer 127a makes the injection of electron smooth and may be made of tris(8-hydroxyquinolino)aluminum (Alq3), PBD, TAZ, spiro-PBD, BAlq, LiF, or SAlq. However, the electron injection layer 127a is not limited thereto.

Here, the present invention is not limited to FIG. 2. At least one of the electron injection layer 127a, the electron transport layer 127b, the hole transport layer 127d, and the hole injection layer 127e may be omitted.

Upper electrodes 128a and 128b may be disposed on the organic light emitting layer 127. One of the upper electrodes 128a and 128b, for example, the upper electrode 128a, may cover an upper part of the organic light emitting layer 127 and the second spacer 125 in the subpixel area (AA). The other electrode, for example, the upper electrode 128b, may cover the second spacer 126 which is disposed outside of the subpixel area (AA).

That is, the upper electrodes 128a and 128b may be separated into the upper electrode 128a disposed inside the subpixel area (AA) and the lower electrode 128b disposed outside the subpixel area (AA). Accordingly, the upper electrodes 128a and 128b may be divided into subpixel areas by the barrier 124.

The upper electrode 128a covering the first spacer 125 and the upper electrode 128b covering the second spacer 126 are in contact with the first contact electrode 109a and the second contact electrode 109b, respectively, when the first substrate 110 is sealed with the second substrate 140 in vacuum.

The upper electrodes 128a and 128b may be selected as a cathode. The upper electrodes 128a and 128b selected as the cathode may be made of opaque material with high reflectivity.

Hereinafter, the first space will be described in more detail.

Referring to FIG. 1 to FIG. the first spacer 125 is formed to have a surface area (SA) equivalent to about 0.5% to 20% of the upper surface area (AA) of the subpixel.

The upper surface area (SA) of the first spacer 125 will be described in more detail with Table 1 showing data obtained from simulations.

TABLE 1

| Surface area (SA) of first spacer | Area (AA) of subpixel | Contact defect ratio | Decrement of opening ratio | Abnormal operation ratio |
|---|---|---|---|---|
| 0.2 | 100 | ▣ | X | ▣ |
| 0.3 | 100 | ○ | X | ○ |
| 0.5 | 100 | X | X | X |
| 1 | 100 | X | X | X |
| 5 | 100 | X | X | X |
| 10 | 100 | X | X | X |

TABLE 1-continued

| Surface area (SA) of first spacer | Area (AA) of subpixel | Contact defect ratio | Decrement of opening ratio | Abnormal operation ratio |
|---|---|---|---|---|
| 15 | 100 | X | X | X |
| 20 | 100 | X | X | X |
| 25 | 100 | X | ○ | X |
| 30 | 100 | X | ▣ | X |

X: No,
○: Average,
□: High

Table 1 clearly shows that the contact defect, the decrement of opening ratio, the abnormal operation are not generated if the first spacer 125 is formed to have an upper surface area (SA) equivalent to about 0.5% or 20% of the upper surface area (AA) of the subpixel.

Therefore, if the first spacer 125 is formed to have an upper surface area (SA) equivalent to about 0.5% or 20% of the upper surface area (AA) of the subpixel, a contact area can be secured between the upper electrode 128a on the first spacer 125 and the first contact electrode 109a, and the contact defect ratio can be reduced, thereby preventing block dot defect from generating at a subpixel. Also, it is possible to prevent the opening rate of the subpixel from decreasing, and to lower an abnormal operation rate of the subpixel, thereby improving reliability thereof.

Accordingly, when the organic light emitting display device according to the present embodiment is tested for analyzing reliability in a high temperature and high humidity atmosphere, the testing results clearly show that the black dot defect problem and the abnormal operation problem are improved.

In addition, when a push test is performed, a problem that a black dot defect is appeared at a subpixel by deformation of the first spacer 125 is improved. Here, the push test is a test that forcedly pushes a panel from the outside. In consideration of a general process margin, it is preferable to form the upper surface area (SA) of the first spacer 125 in a form above top 1% of Table.

Referring to FIG. 1 to FIG. 5, the first spacer 125 may be formed in a trapezium having an upper area having a narrower slop (r) than a base area. The slop (r) of the first spacer 125 may be about 30° to 70°. If the slop (r) of the first spacer 125 is greater than 30°, a proper contact area between the upper electrode 128a and the first contact electrode 109a is sustained, thereby preventing exfoliation of the upper electrode 128a due to concentration of current applied when a signal is transferred between the upper electrode 128a and the first contact electrode 109a. It is also possible to prevent the upper electrode 128a on the first spacer 125 from damage by pressure when the first substrate 110 is sealed with the second substrate 140. When a push test for forcedly pushing a panel from the outside is performed after manufacturing the panel, it may have a high resisting power against an external pressure. If the slop (r) of the first spacer 125 is smaller than 70°, it is possible to prevent a corner area of the upper electrode 128a on the first spacer 125 from damaging. It is also possible to prevent the upper electrode 128a from opening (cutting). Furthermore, it is possible to prevent the upper electrode 128a from exfoliation after analyzing the reliability of the panel.

Meanwhile, although the second spacer 126 may be formed in a trapezium shape like the first spacer 125, the second spacer 126 is not limited thereto. Like the first spacer 125, the second spacer 126 also has the same slop of the first spacer 125. However, the second spacer 126 is not limited thereto.

The organic light emitting display device according to the present embodiment can display images by controlling the emission layer to emit lights using electrons and holes that are transported through the lower electrode 121 connected to the power line and the upper electrode 128a connected to the source 105 or the drain 106 of the transistor when the scan signal and the data signal are applied through the scan line and the data line.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. An organic light emitting display device comprising:
    a first substrate;
    a second substrate facing the first substrate;
    a plurality of transistors on the first substrate;
    a first contact electrode disposed on at least one transistor and connected to a source or a drain of said at least one transistor;
    a subpixel on the second substrate;
    a first spacer projected to make an upper electrode included in the subpixel to be in contact with the first contact electrode;
    a second contact electrode disposed on a second insulation layer to cover at an upper part of at least one of the transistor and a power line on the first substrate; and
    a second spacer projected to be in contact with the second contact electrode,
    wherein an upper surface area of the first spacer is about 0.5% to 20% of an upper surface area of the subpixel,
    wherein the second contact electrode is connected to the power line on the first substrate, and a lower electrode is connected to the second contact electrode by the second spacer.

2. The organic light emitting display device of claim 1, wherein the subpixel includes the lower electrode on the second substrate, a bank layer having an opening and disposed on the lower electrode, an organic light emitting layer disposed on the lower electrode exposed through the opening, and an upper electrode on the organic light emitting layer.

3. The organic light emitting display device of claim 2, wherein the subpixel includes a barrier that defines an area of the subpixel, and the barrier is disposed on the bank layer.

4. The organic light emitting display device of claim 3, wherein the first spacer is disposed on the bank layer between the barriers, and the upper electrode covers the first spacer.

5. The organic light emitting display device of claim 1, wherein the first spacer is formed in a trapezium shape that has an upper area having a slop narrower than that of a base area.

6. The organic light emitting display device of claim 1, wherein a slop of the first spacer is about 30° to 70°.

7. The organic light emitting display device of claim 3, wherein the barrier is a taper type in which an upper area is narrower than a base area.

8. The organic light emitting display device of claim 2, wherein the subpixel includes an auxiliary electrode connected to the lower electrode.

9. The organic light emitting display device of claim 3, wherein the subpixel includes an auxiliary electrode disposed at a lower part of the bank layer, and the auxiliary electrode overlaps with an area where the barrier is disposed.

10. The organic light emitting display device of claim 1, wherein the second spacer is disposed at an outline of the first substrate and the second substrate.

11. The organic light emitting display device of claim 1, wherein the transistor includes a gate on the first substrate, a first insulation layer on the gate, an active layer on the first insulation layer, a source and a drain on the active layer, and the second insulation layer on the source and the drain.

12. The organic light emitting display device of claim 3, wherein the upper electrode is divided into areas of the subpixels by the barrier.

13. The organic light emitting display device of claim 1, wherein the first spacer is made of an organic material or an inorganic material.

* * * * *